(12) United States Patent
Uehara

(10) Patent No.: US 6,457,149 B1
(45) Date of Patent: *Sep. 24, 2002

(54) SEMICONDUCTOR INTEGRATED CIRCUIT AND SEMICONDUCTOR INTEGRATED CIRCUIT TEST METHOD

(75) Inventor: Teruaki Uehara, Tokyo (JP)

(73) Assignee: Oki Electric Industry Co, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 39 days.

(21) Appl. No.: 09/216,478

(22) Filed: Dec. 21, 1998

(30) Foreign Application Priority Data

Mar. 18, 1998 (JP) .............................. 10-069005

(51) Int. Cl.[7] ................................................. H04B 17/00
(52) U.S. Cl. ....................................... 714/724; 714/726
(58) Field of Search .................................. 714/724, 726

(56) References Cited

U.S. PATENT DOCUMENTS 4,167,780 A * 9/1979 Hayashi
5,898,701 A * 4/1999 Johnson ...................... 714/726

* cited by examiner

Primary Examiner—Phung M. Chung
(74) Attorney, Agent, or Firm—Rabin & Berdo, P.C.

(57) ABSTRACT

With this invention, operation testing can be performed using general operation and emulation operation. With the MPU of this invention, using emulation operation, commands for transferring data between register with scanning function 104 and register without scanning function 103 are input by scanning to command register with scanning function 101. Next, using general operation, the command execution is performed. Following this, the data of register 104 with scanning function is read. With this invention, it is possible to provide a semiconductor integrated circuit with a small circuit scale and with a short time required for operation testing.

15 Claims, 7 Drawing Sheets

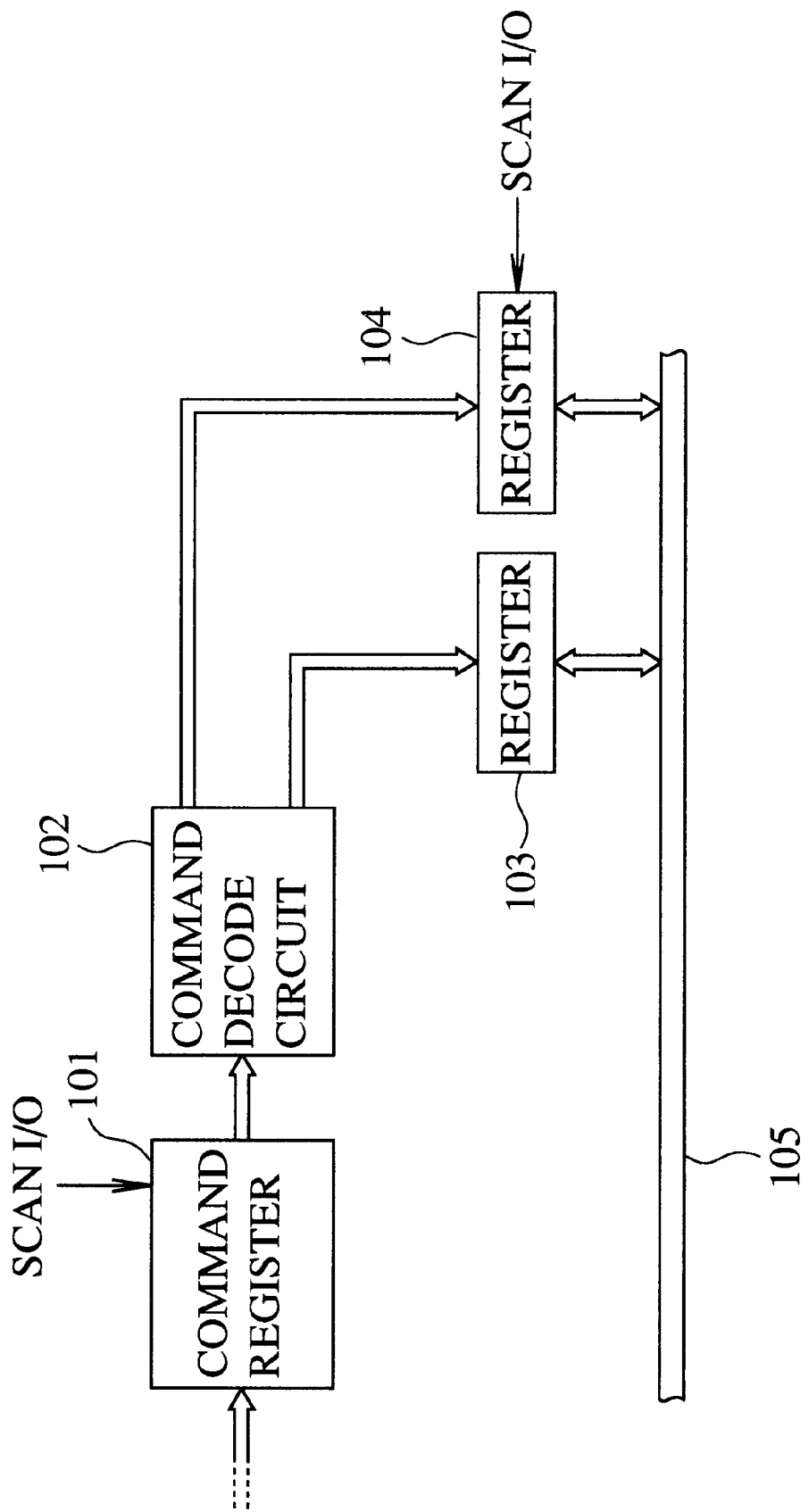

FIG.3 TYPICAL OPERATION

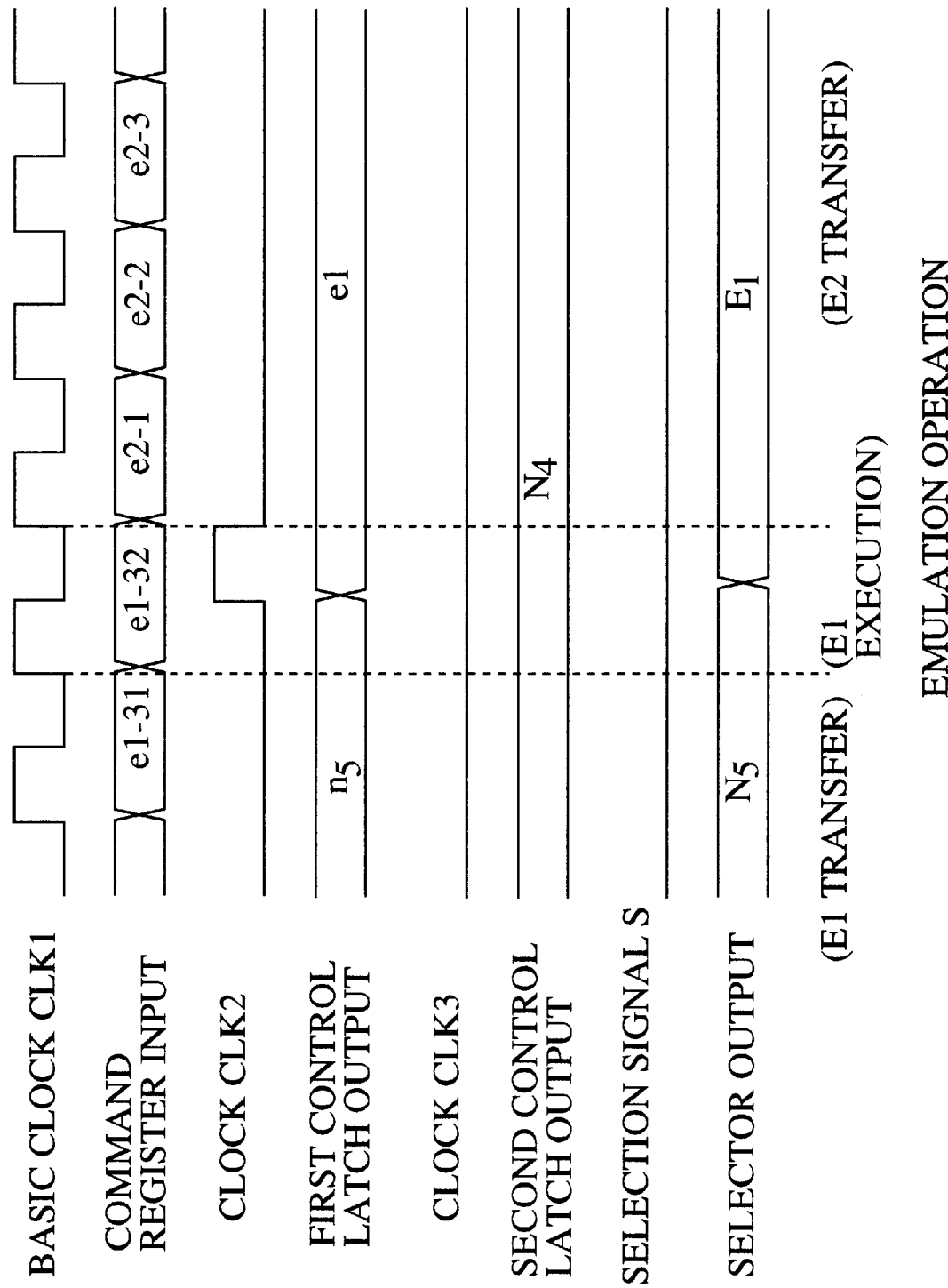

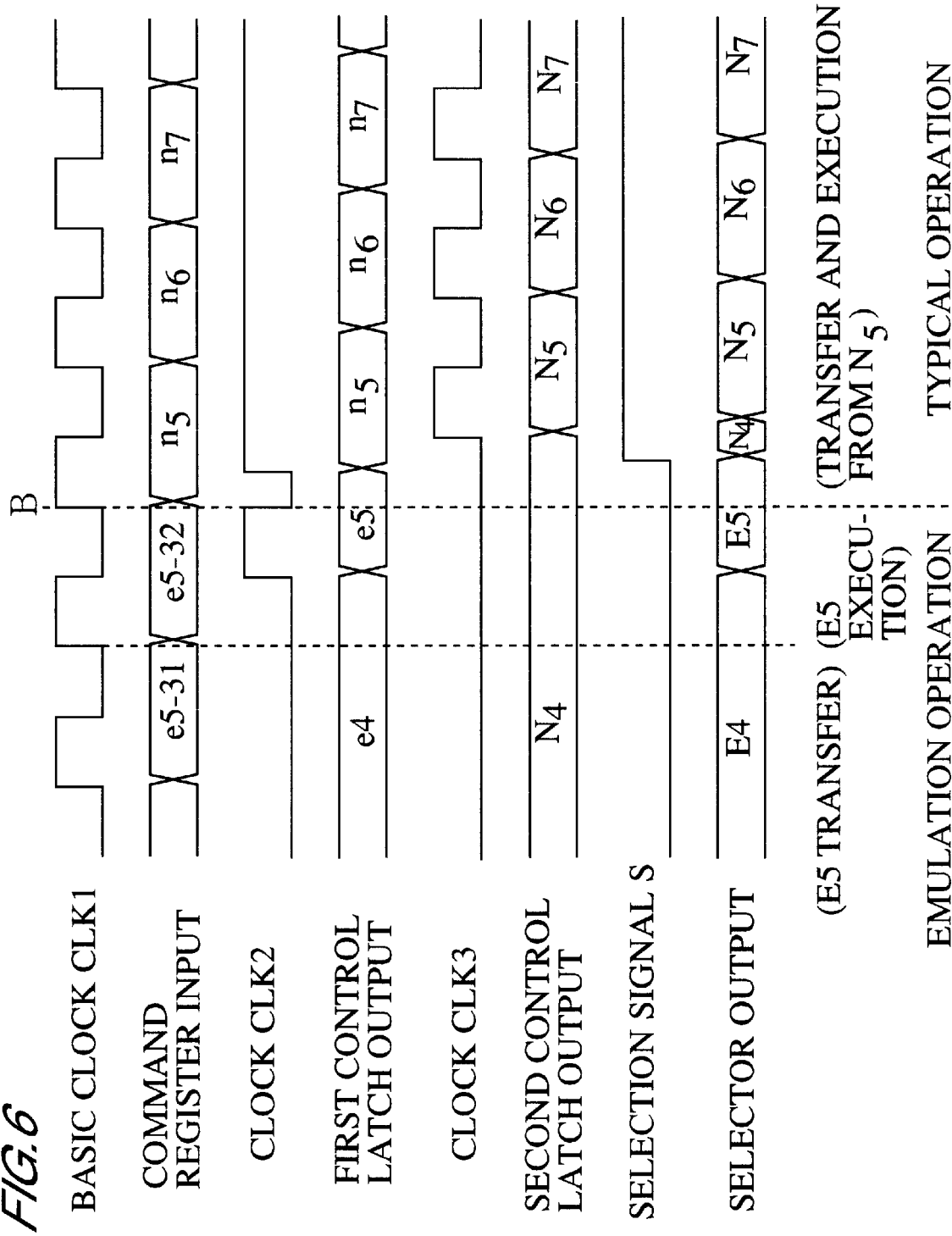

SEMICONDUCTOR INTEGRATED CIRCUIT AND SEMICONDUCTOR INTEGRATED CIRCUIT TEST METHOD

BACKGROUND OF THE INVENTION

1. Field of the Invention

This invention concerns semiconductor integrated circuits equipped with a function that performs operation testing as well as the operating testing method of semiconductor integrated circuits.

2. Description of Related Art

ICE (In Circuit Emulator) and ONCE (On Chip Emulator) are known as technologies for performing operating tests on MPUs (Micro Processing Unit). However, ICE requires long wiring, so it can not handle the higher speeds of MPUs in recent years. Therefore, ONCE has come into general use in recent years. ONCE is typically used specifically for MPUs with operating frequencies of 50 MHz or greater.

ONCE is a technology with which an MPU with a built in emulation circuit is formed on a semiconductor chip, and hardware operation testing is performed using this emulation circuit.

Conventional built-in type emulation circuits were realized by using registers with a scanning function for all registers in the MPU.

However, when using registers with a scanning function, there is the disadvantage that the MPU circuit scale becomes large. In other words, with registers with a scanning function, a selector must be equipped for each bit, so the circuit scale increases accordingly.

Also, with conventional emulation circuits, scanning is performed with all registers connected serially, so even when writing or reading data for only part of the registers, a scan must be performed for all registers. This brings the disadvantage of the time required for emulation operation being long with conventional emulation circuits. For example, if the total bit count for each register installed in an MPU is 4000 bits, even when a user wants to read only 1 bit of one of the registers, 4000 clock cycles are required.

SUMMARY OF THE INVENTION

The object of this invention is to provide a semiconductor integrated circuit with a small circuit scale and short time needed for emulation operation, and to provide a semiconductor integrated test method which is performed with a small circuit and short time.

(1) The semiconductor integrated circuit of this invention is equipped with a data register with a scanning function for performing output of data input by scanning to an external bus and outputting by scanning data fetched from this external bus during emulation operation, and with a command register with scanning function that inputs by scanning commands for transferring data from the external bus to another register or commands for transferring data from another register to an external bus during emulation operation.

(2) The semiconductor integrated circuit test method of this invention performs operation testing of the semiconductor integrated circuit through general operation and emulation operation, and the emulation operation is composed of a step of outputting data that was input by scanning onto an external bus to the data register with a scanning function and a step of inputting by scanning commands for transferring data from an external bus to another register to a command register with scanning function, and a step of executing the command that the command register with scanning function input by scanning by the inputting step using a latter circuit after decoding using a command decoding circuit.

(3) Another semiconductor integrated circuit test method of this invention performs semiconductor integrated circuit operation testing through general operation and emulation operation, and the emulation operation is composed of a step of scanning by input to the command register with scanning function a command for transferring data from a specified register to an external bus, a step of executing the command which was input by scanning by the command register with scanning function by the scanning step, and a step of fetching the data on the external bus and outputting it by scanning to the data register with scanning function.

BRIEF DESCRIPTION OF THE DRAWINGS

We will explain the other objects and advantages of this invention through description while referring to the following attached figures.

FIG. 1(A) is a block diagram showing an overview of the major component structure of the semiconductor integrated circuit of the first preferred embodiment.

FIG. 5 is a timing chart that explains the operation of the semiconductor integrated circuit of the second preferred embodiment.

FIG. 6 is a timing chart that explains the operation of the semiconductor integrated circuit of the second preferred embodiment.

DESCRIPTION OF THE PREFERRED EMBODIMENTS

Following we will use the figures to explain preferred embodiments of this invention. In the figures, the size of each structural component, the form and layout relationships are shown in overview form simply to a degree by which the invention can be understood, and the numerical value conditions explained below are merely examples to make the invention understood.

First Preferred Embodiment

Figure 1B:
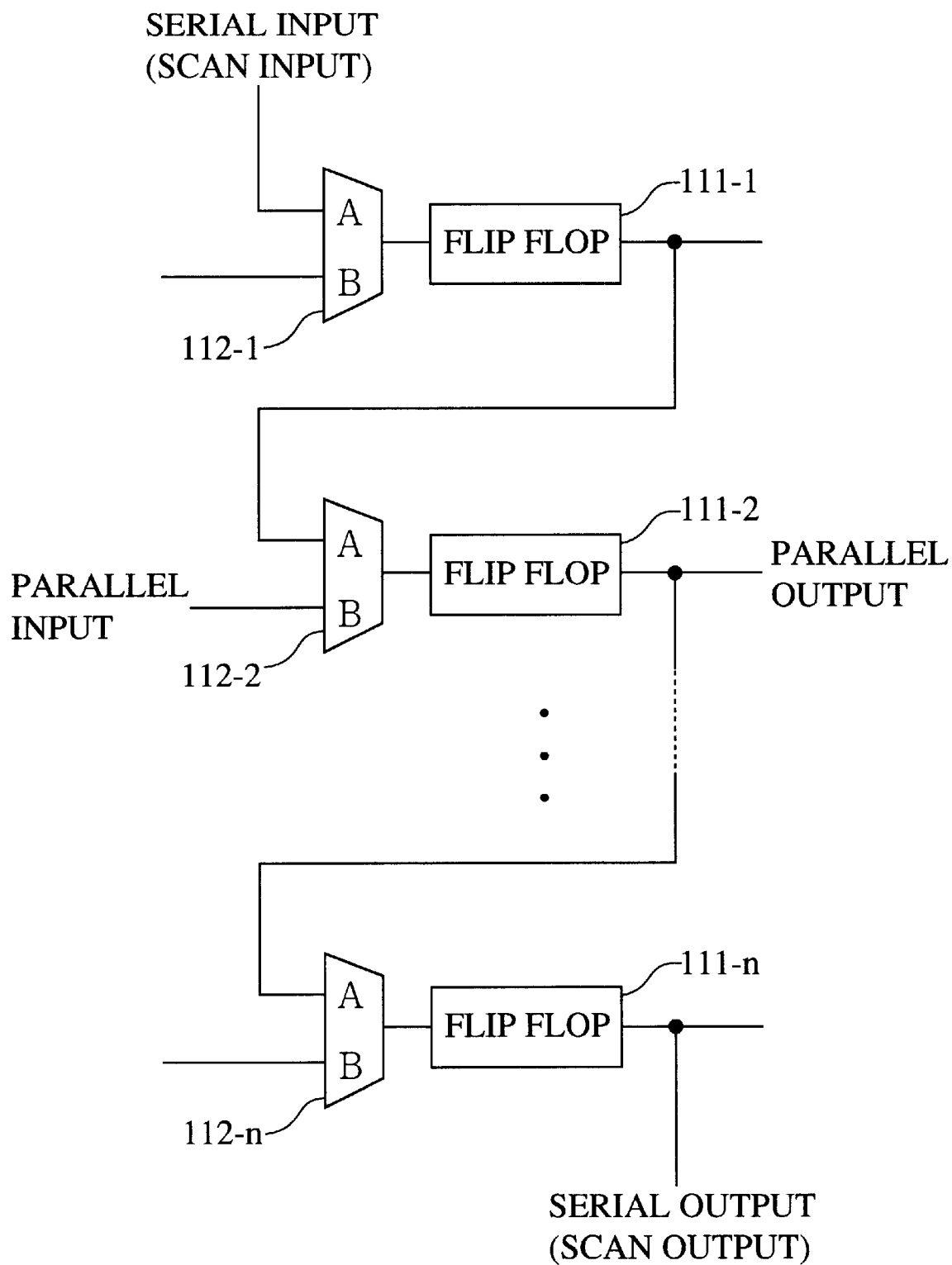
FIG. 1(B) is a block diagram showing an overview of the internal structure of the registers with scanning function.
Figure 2:
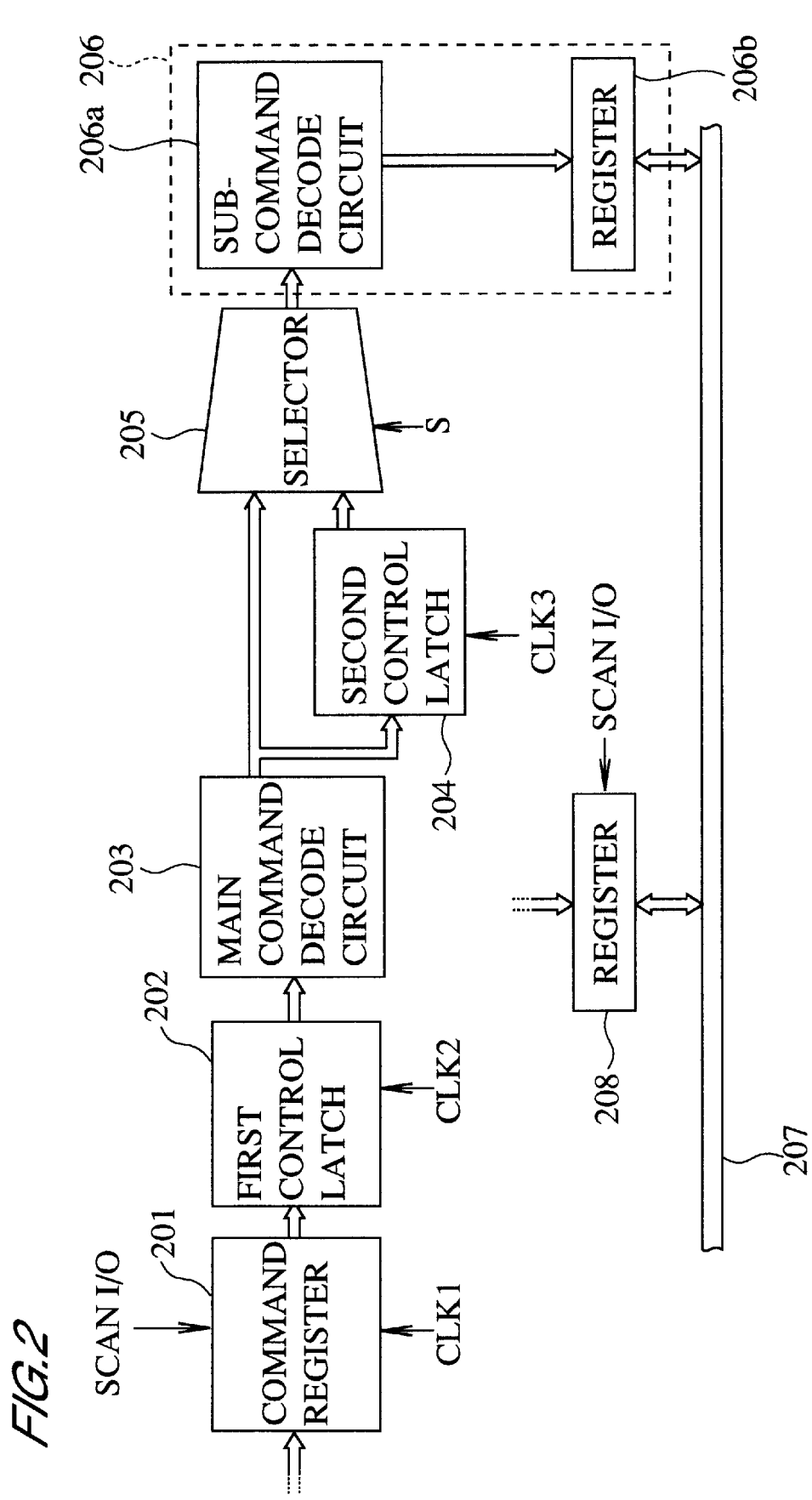
FIG. 2 is a block diagram showing an overview of the major component structure of the semiconductor integrated circuit of the second preferred embodiment

First we will explain the form of the first preferred embodiment of this invention using FIGS. 1 and 2.

In FIG. 1(A), command register with scanning function 101 is equipped with n bit (e.g. 32 bits) parallel input terminals and parallel output terminals as well as serial input terminals and output terminals (scanning input terminals and scanning output terminals). Here, selection of parallel input and serial input as well as parallel output and serial output is performed by switching the selector in command register 101 using a control signal that is not illustrated.

Command decoding circuit 102 decodes and outputs transfer commands which are parallel input from command register 101.

Register 103 fetches data in parallel from external bus 105 or outputs data in parallel to external bus 105 based on transfer commands input from command decoding circuit 102.

Register with scanning function 104 is the register that performs input and output of data between external bus 105 and external devices (not illustrated), and it serially inputs data from external sources (input by scanning) and outputs this onto external bus 105, and then serially outputs (outputs by scanning) data on external bus 105 to an external device.

As shown in FIG. 1(B), command register 101 is equipped with n selectors 112-1 to 112-n to correspond with n bit Flip Flops 111-1 to 111-n. Register 101 performs scanning after serially connecting each Flip Flop 111-1 to 111-n by selecting input A for each selector 112-1 to 112-n, and performs input and output in parallel for each Flip Flop 111-1 to 112-n by selecting input B for each selector 112-1 to 112-n. The internal structure of register 104 is the same as that shown in FIG. 1(B).

Next, we will explain the procedure for performing operation testing of the MPU shown in FIG. 1.

First, for operation when observing data stored in any register within the MPU, we will describe an example of reading data stored in register 103.

In the beginning, as general operation, command register 101 inputs commands (for example, transfer commands or arithmetic operational commands) in parallel, and sends them to command decoding circuit 102. Command decoding circuit 102 decodes these commands. The decoded results are executed with the timing of the next basic clock. This execution causes the transfer data or arithmetic operation results, etc. to be stored in register 103.

Next, general operation is suspended, and emulation operation is performed. With this emulation operation, first, the command that transfers data from register 103 via external bus 105 to register 104 is input by scanning to command register 101. This transfer command is executed after being transferred in parallel from command register 101 to command decoding circuit 102 and being decoded there. Through this action, the data in register 103 is transferred via external bus 105 to register 104. This data is output by scanning from register 104 and read to an external device. Following this emulation operation, when performing observation of another register that is not illustrated, the same kind of emulation operation is continued.

Following, it is possible to perform MPU operation testing by repeating general operation and emulation operation in the same manner.

Next, for changing data of any register in the MPU, we will explain an example of changing the data in register 103.

First, as emulation operation, data to be changed is input by scanning from an external device to register 104. Next, command register 101 inputs by scanning a transfer command from an external source. This transfer command is parallel transferred from command register 101 to command decoding circuit 102, and execution is performed in the same manner as described above. With this execution, the data in register 104 is transferred via external bus 105 to register 103. When changing (i.e. data storage) data for other registers that are not illustrated, the same emulation operation is continued.

After that, by performing a specified general operation, it is possible to perform operation testing based on these stored data.

In this way, with the preferred embodiment, it is possible to install a scanning function for only command register 101 and data register 104, so it is not necessary to install a scanning function for the other registers. Therefore, it is possible to make the overall MPU circuit scale smaller.

Also, except for input and output of transfer commands for command register 101 and input and output of data for register 104, parallel I/O can be used, allowing a reduction of the time needed for emulation operation.

Second Preferred Embodiment

Next we will describe a second preferred embodiment of the invention using FIGS. 2 through 6. With this preferred embodiment, we will describe an example of performing an operation test for a pipeline control MPU.

In FIG. 2, command register 201 with scanning function, as with command register 101 of the first preferred embodiment, is equipped with n bit (e.g. 32 bits) parallel input terminals and parallel output terminals as well as serial input terminals and output terminals (scanning input terminals and scanning output terminals). Switching between parallel input and serial input is performed by switching the selector in command register 201 (see FIG. 2) using a control signal that is not illustrated. This command register 201 operates with the rise timing of basic clock CLK1.

First control latch 202 passes input from command register 201 as is when clock CLK2 is high, and holds the output before the fall of clock CLK2 as is when clock CLK2 is low.

Main command decoding circuit 203 decodes commands input from first control latch 202 and outputs them.

Second control latch 204 passes the input from main command decoding circuit 203 as is when clock CLK3 is high, and holds the output before clock CLK3 falls as is when clock CLK3 is low.

Selector 205 selectively outputs input from main decoding circuit 203 when control signal S is low and input from second control latch 204 when control signal S is high.

Sub-unit 206 is equipped with subcommand decoding circuit 206a that decodes commands input from selector 205 and register 206b that holds output data of this subcommand decoding circuit 206a. The output terminal of this register 206b is connected to external bus 207.

Data register with scanning function 208 is a register that performs input and output of data between external bus 105 and external devices (not illustrated), and outputs data from an external source by serial input (scan input) onto external bus 207, and also serial outputs (scan outputs) data on external bus 207 to an external device.

Figure 3:
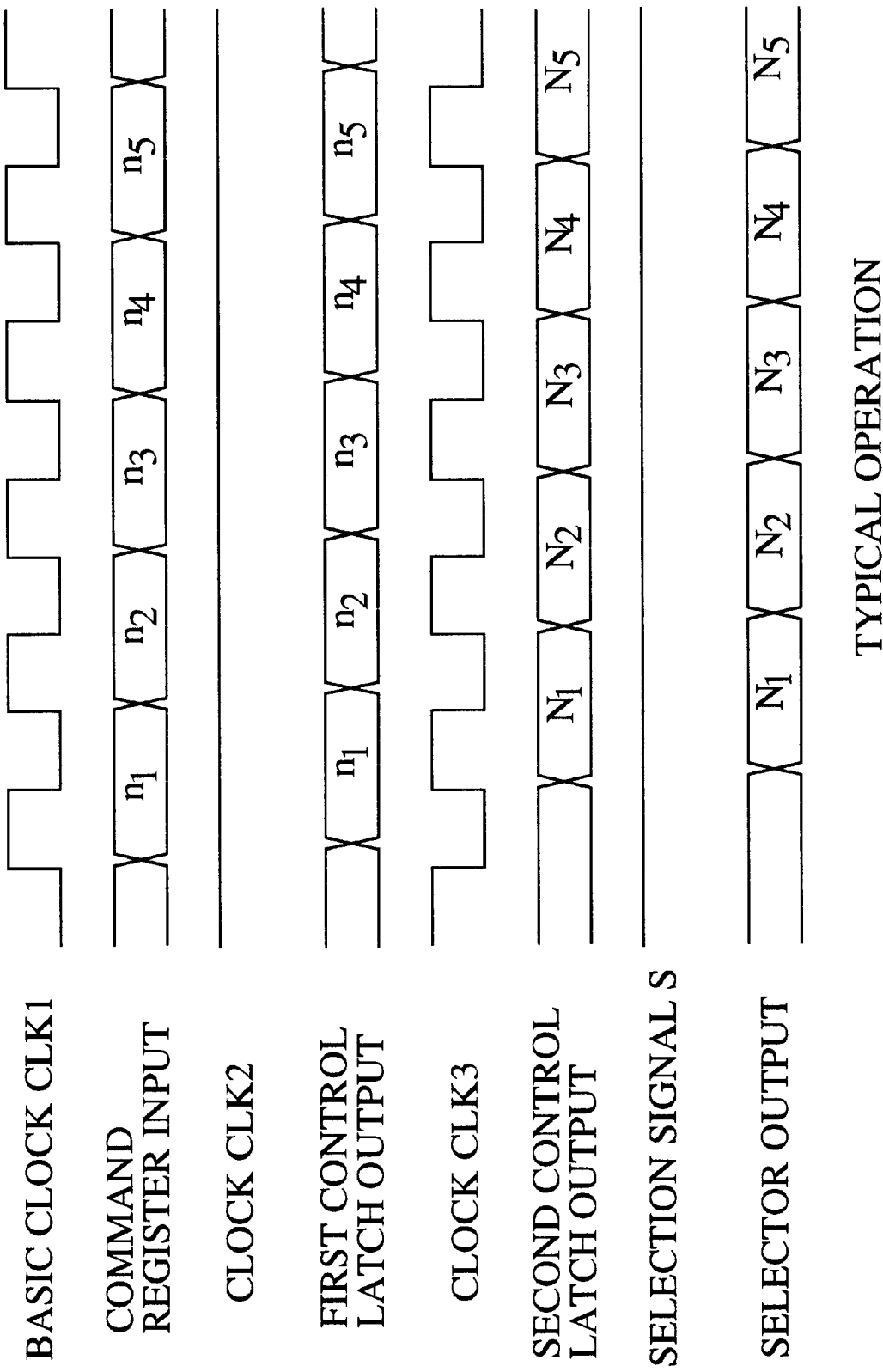
FIG. 3 is a timing chart that explains the operation of the semiconductor integrated circuit of the second preferred embodiment.
Figure 4:
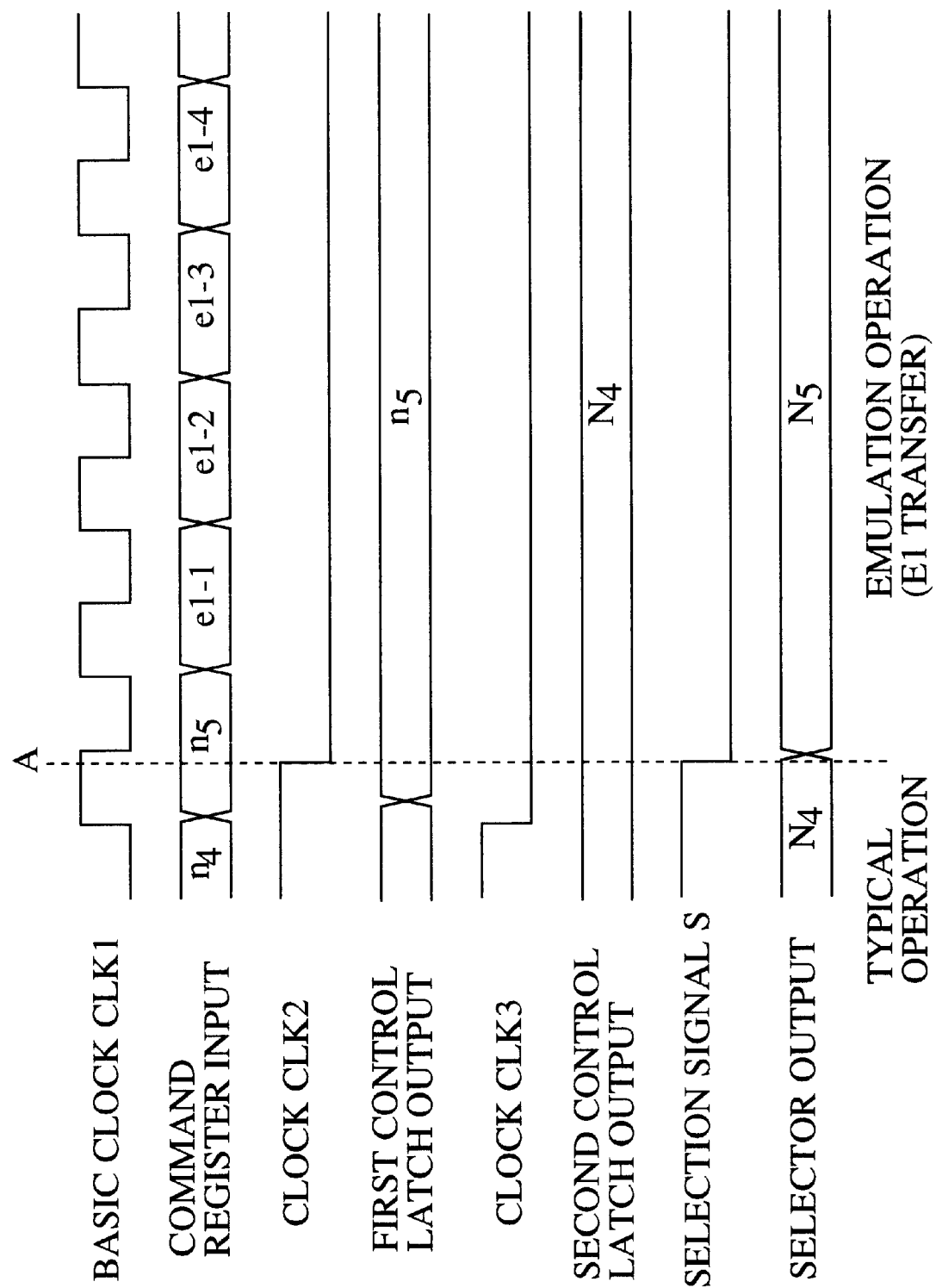
FIG. 4 is a timing chart that explains the operation of the semiconductor integrated circuit of the second preferred embodiment.

Next, we will describe the operation of the MPU shown in FIG. 2 using FIGS. 3 through 5 for reference.

As with the first preferred embodiment, the MPU operation test is performed by executing alternate switching between general operation and emulation operation.

As shown in FIG. 3, first, as general operation, command register 201 fetches in parallel commands n1, n2, . . . in sequence and outputs them with the rise timing of basic clock CLK1. At this time, clock CLK2 is fixed at high level, so first control latch 202 passes as is commands n1, n2, . . . input from command register 201. These commands n1, n2, . . . are input to main command decoding circuit 203, and after decoding, commands N1, N2, . . . are input to second control latch 204.

Second control latch 204 inputs as clock CLK3 a clock of opposite phase to basic clock CLK1. Therefore, this second control latch 204 fetches and outputs commands N1, N2, with the fall timing of basic clock 101 (in other words, a half cycle delayed from the output of commands n1, n2, ... by command register 201).

At this time, control signal S is high, so selector 205 selects the output of second control latch 204, and sends it to sub-unit 206.

Subcommand decoding circuit 206a of sub-unit 206 decodes in sequence the related commands N1, N2, ... and outputs them.

After that, each command N1, N2, ... is executed.

The MPU of this preferred embodiment performs pipeline processing, so each structural component 201 through 206 operates in parallel as shown in FIG. 3.

Here, as shown in FIG. 4, immediately after command register 201 fetches command n5 (the point shown by code A in FIG. 4), a switch is made from general operation to emulation operation.

At the time of this switch, clock CLK2 and selection signal S change from high to low, and clock CLK3 is fixed at low. Here, by changing clock CLK2 to low, first control latch 202 is maintained by command n5. Also, at this time, subcommand decoding circuit 206a executes command N4 (command N5 is not executed).

After this switch, command register 201 starts scan input of the transfer command for emulation processing with the rise timing of basic clock CLK1. In other words, n bit (32 bits in this case) transfer command e1 (with each bit as e1-1, e1-2, ... e1-32) is sequentially input to command register 201 with the rise timing of basic clock CLK1.

When command register 201 fetches the final bit e1-32 of transfer command e1, as shown in FIG. 5, clock CLK2 changes to high with the fall timing of basic clock CLK1. With the rise timing of this clock CLK2, each bit e1-i, e1-2, ... e1-32 of transfer command e1 fetched to command register 201 is passed in parallel to first control latch 202 and input to main command decoding circuit 203. Then, this main command decoding circuit 203 outputs transfer command E1 after decoding it. At this time, control signal S is low, so transfer command E1 is input to sub-unit 206 via selector 205. After this, with the execution of this transfer command, transfer, etc. as emulation operation can be performed between any register and external bus 207, and the details are the same as with the first preferred embodiment, so we will not explain the details here.

Command register 201 starts scanning input of transfer command e2 for the next emulation processing with the next rise timing of basic clock CLK1. At this time, clock CLK2 is again fixed at low level. Then, when command register 201 fetches final bit e2-32 of transfer command e2, clock CLK2 changes to high with the rise timing of basic clock CLK1. Thus, as with the case described above, after this transfer command e2 is decoded by main command decoding circuit 203 to make transfer command E2, it is input to sub-unit 206 via selector 205.

The same is done thereafter, and fetching and execution of transfer commands e3, e4, ... after the third time are repeated.

When the final bit (e5-32 used for this example) of the final emulation operation transfer command is fetched to command register 201, clock CLK2 goes high, and transfer command e5 is fetched to main command decoding circuit 203 (therefore decoded command E5 is input to sub-unit 206), as shown in FIG. 6, a switch is made from emulation operation to general operation. Here, a switch is made from emulation operation to general operation at the point indicated by code B in FIG. 6.

At this time, once clock CLK2 is fixed to low, after command register 201 fetches general operation command n5, it is fixed to high. Thus, first control latch 202 again passes command register 201 output as is. Then by changing control signal S to high, selector 205 selects the output of second control latch 204.

Clock CLK3 changes from a low fixed state to a clock of the opposite phase of basic clock CLK1. Thus, commands N5, N6, ... output from main command decoding circuit 203 are sequentially sent from second control latch 204 via selector 205 to sub-unit 206. Before switching from emulation operation to general operation, command N4 is latched to second control latch 204, and with this switch, is output from selector 205. However, this command N4 is not executed immediately after the switch.

In this way, with this preferred embodiment, during emulation operation, the same timing skew is generated using first control latch 202 instead of performing a timing adjustment using second control latch 204 (delay of a half cycle of basic clock CLK1). This allows the timing of command input to sub-unit 206 to be made constant regardless of whether a unit is in general operation or emulation operation, so MPU control during test operation can be simplified.

The ability to reduce the overall MPU circuit scale and to shorten the time required for emulation operation are the same as for the previously described first preferred embodiment.

As described in detail above, with this invention, it is possible to provide a semiconductor integrated circuit and semiconductor integrated circuit testing method for which the circuit scale is small and the time required for emulation operation is short.

What is claimed is:

1. A semiconductor integrated circuit comprising:
   a data register with a scanning function that, during emulation operation, performs output of data input by scanning to an external bus or output by scanning of data fetched from an external bus; and
   a command register with a scanning function that, during said emulation operation, performs input by scanning commands for transferring data from said external bus to other registers or commands for transferring data from said other registers to said external bus.

2. The semiconductor integrated circuit according to claim 1, comprising:
   a first delay circuit that sends, as is, input from said command register with a scanning function to a command decoding circuit during normal operation, and that sends the input from said command register with a scanning function to said command decoding circuit skewed by a half cycle of a basic clock during said emulation operation; and
   a second delay circuit that outputs input from said command decoding circuit skewed by a half cycle of the basic clock during said normal operation and that outputs, as is, input from said command decoding circuit during said emulation operation.

3. The semiconductor integrated circuit according to claim 2, wherein said first delay circuit contains a first latch, an operating clock potential of which is fixed to a data passing state during said normal operation, and the operating clock has opposite phase to said basic clock during said emulation operation.

4. The semiconductor integrated circuit according to claim 2, wherein said first delay circuit has a second latch that passes an input as an operation clock with opposite phase to said basic clock, and has a first selector that selects the output of said command register during said normal operation and that selects the output of said second latch during said emulation operation.

5. The semiconductor integrated circuit according to claim 2, wherein said second delay circuit contains a third latch, the operating clock of which has opposite phase to said basic clock during said normal operation, and said operating clock is fixed to a data passing state during said emulation operation.

6. The semiconductor integrated circuit according to claim 2, wherein said second delay circuit has a fourth latch receiving an input as an operating clock with opposite phase to said basic clock, and has a second selector that selects the output of this fourth latch during said normal operation and that selects the output of the command decoding circuit during said emulation operation.

7. A semiconductor integrated circuit test method, said test method during emulation operation, comprising the steps of:
   with a data register having a scanning function, outputting data from the data register, including scanning the data from the data register onto an external bus;
   with a command register having a scanning function, inputting commands by scanning the commands into the command register, the commands for transferring data from said external bus to other registers;
   using a command decoding circuit, decoding the commands having been input by scanning to the command register; and
   after said decoding, executing the decoded commands, using an other circuit.

8. The semiconductor integrated circuit test method according to claim 7, wherein said step of executing contains a step of sending an output of said command register with the scanning function to said command decoding circuit, with a skew from normal operation by half a cycle of the basic clock, and sending the output of said command decoding circuit to said other circuit at a half cycle of said basic clock faster than said normal operation.

9. A semiconductor integrated circuit test method, said test method, during emulation operation, comprising the steps of:
   inputting by scanning a command for transferring data from any of a plurality of registers, to an external bus, to a command register with a scanning function;
   executing commands input by scanning with said command register having the scanning function with said inputting step with another circuit after decoding by the command decoding circuit; and
   fetching and outputting by scanning data on said external bus to a data register with a scanning function.

10. The semiconductor integrated circuit test method according to claim 9, wherein said executing step includes a step of sending an output of said command register with the scanning function to said command decoding circuit skewed by half a cycle of the basic clock from a normal operation time, and sending an output of said command decoding circuit to said another circuit by one half cycle of said basic clock faster than said normal operation time.

11. A semiconductor integrated circuit that performs a normal operation and an emulation operation for operation testing, comprising:
   a bus for transferring data;
   a first data storing circuit for storing data, which has a first data input/output terminal connected to the bus for inputting or outputting data in parallel, and has a scan input/output terminal for inputting or outputting data serially during the emulation operation;
   a second data storing circuit for storing data, which has a second data input/output terminal connected to the bus for inputting or outputting data in parallel;
   a command storing circuit for storing a command, which has a command input terminal for inputting commands in parallel, and has a command input/output terminal for receiving a command for transferring data from the first data storing circuit to the second data storing circuit or receiving a command for transferring data from the second data storing circuit to the first data storing circuit, serially, during the emulation operation; and
   a command decoding circuit for decoding a command stored in the command storing circuit.

12. A semiconductor integrated circuit according to claim 11, further comprising a first latch circuit transferring an output of the command storing circuit to the command decoding circuit in response to a first logic level of a first control signal during the normal operation, and latching output of the command storing circuit in response to second logic level of the first control signal during the emulation operation.

13. A semiconductor integrated circuit according to claim 11, further comprising:
   a second latch circuit transferring an output of the command decoding circuit in response to a first logic level of a second control signal during the normal operation, and latching output of the command decoding circuit in response to a second logic level of the second control signal during the emulation operation;
   a selector selecting output of the second latch circuit during the normal operation and selecting the output of the command decoding circuit during the emulation operation.

14. A semiconductor integrated circuit test method, said test method for performing a normal operation and an emulation operation for operation testing, said test method comprising the steps of:
   inputting data by scanning to a first data storing circuit that has a scanning function;
   inputting a transfer command by scanning to a command storing circuit, the transfer command to transfer data from the first data storing circuit to a second data storing circuit;
   decoding the transfer command stored in the command storing circuit, by a command decoding circuit; and
   performing the transfer command decoded by the command decoding circuit.

15. A semiconductor integrated circuit test method, said test method for performing a normal operation and an emulation operation for operation testing, said test method comprising the steps of:
   inputting a transfer command to a command storing circuit by scanning, the transfer command to transfer data from the first data storing circuit to a second data storing circuit which has scanning function;
   decoding the transfer command stored in the command storing circuit, by a command decoding circuit;
   performing the transfer command decoded by the command decoding circuit; and
   outputting data by scanning from the second data storing circuit.

* * * * *